(12) United States Patent
Mochizuki et al.

(10) Patent No.: US 7,038,313 B2
(45) Date of Patent: May 2, 2006

(54) SEMICONDUCTOR DEVICE AND METHOD OF MANUFACTURING THE SAME

(75) Inventors: Eiji Mochizuki, Nagano (JP); Yoshitaka Nishimura, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 51 days.

(21) Appl. No.: 10/832,253

(22) Filed: Apr. 27, 2004

(65) Prior Publication Data
US 2004/0232544 A1 Nov. 25, 2004

(30) Foreign Application Priority Data
May 6, 2003 (JP) ............................... 2003-128323

(51) Int. Cl.
*H01L 21/44* (2006.01)
(52) U.S. Cl. ...................... 257/713; 257/648; 257/720; 438/122
(58) Field of Classification Search ...................... None
See application file for complete search history.

(56) References Cited

U.S. PATENT DOCUMENTS 5,097,318 A * 3/1992 Tanaka et al. ............... 257/690
6,309,737 B1 * 10/2001 Hirashima et al. .......... 428/210

FOREIGN PATENT DOCUMENTS

| JP | 09055392 A | * | 2/1997 |
| JP | 11-54677 | | 2/1999 |
| JP | 2001-39777 | | 2/2001 |
| JP | 2001-58255 | | 3/2001 |
| JP | 2003-204021 | | 7/2003 |

* cited by examiner

*Primary Examiner*—Leonardo Andujar
(74) *Attorney, Agent, or Firm*—Manabu Kanesaka

(57) ABSTRACT

A semiconductor device includes a circuit board formed of an insulator substrate and having conductor patterns on both surfaces thereof, a semiconductor chip bonded to the circuit board with one of the conductor patterns therebetween, and a radiator base bonded to the circuit board with a solder layer through the other of the conductor patterns therebetween for conducting heat generated in the semiconductor chip to an outside device. The radiator base is formed of a material having anisotropic thermal conductivity so that the radiator base has thermal conductivity in a direction perpendicular to a bonding plane between the radiator base and the circuit board higher than that along the bonding plane. The radiator base has thermal expansion coefficient along a bonding plane with the circuit board different from that along the bonding plate of the insulator substrate by a predetermined value.

10 Claims, 5 Drawing Sheets

SEMICONDUCTOR DEVICE AND METHOD OF MANUFACTURING THE SAME

BACKGROUND OF THE INVENTION AND RELATED ART STATEMENT

The present invention relates to a semiconductor device including a circuit board, a semiconductor chip on one surface of the circuit board, and a radiator base on the other surface of the circuit board for radiating heat generated in the semiconductor chip, and a method of manufacturing the semiconductor device. Specifically, the present invention relates to a semiconductor device in which the circuit board and the radiator base are bonded with soldering, and a method of manufacturing the semiconductor device.

In association with the recent improvement in performance of semiconductor devices mounted on electronic instruments, the quantity of heat generated in the semiconductor devices has increased. To dissipate the generated heat, a heat sink has been employed as external heat dissipating means. FIG. 8 is a cross sectional view of a conventional semiconductor device having such heat dissipating means.

Referring now to FIG. 8, the conventional semiconductor device 101 includes a circuit board 110; a heat generating chip (hereinafter referred to as "silicon chip" or "semiconductor chip") 102 such as an IGBT and a FWD (free wheel diode) soldered to one surface of the circuit board 110; and a radiator base 103 soldered to the other surface of the circuit board 110 for dissipating the heat. The circuit board 110 includes an insulator substrate 111 having conductor patterns (circuit patterns) 112 and 113 made of a copper foil or an aluminum foil formed thereon. The radiator base 103 is made of a metal plate such as a copper plate.

The conductor patterns 112 and 113 are bonded to the surfaces of the insulator substrate 111 with direct bonding or active metal bonding to form the circuit board 110. The semiconductor chip 102 is soldered to the conductor pattern 112 on one of the surfaces of the circuit board 110. The radiator base 103 is soldered to the conductor pattern 113 on the other of the surfaces of the circuit board 110. Therefore, a solder layer 114 is formed between the semiconductor chip 102 and the circuit board 110, and a solder layer 115 is formed between the circuit board 110 and the radiator base 103.

As described above, the conventional semiconductor device 101 has a laminate structure of the insulator substrate (circuit board) bonded to the radiator base with soldering. In general, the insulator substrate and the radiator base are formed of materials having different coefficients of thermal expansion (CTE) as shown in Table 1. Due to the difference in the CTEs of the different materials, the radiator base 103 deforms as shown in FIG. 9 immediately after the semiconductor device or the electronic instrument having the semiconductor device is assembled.

TABLE 1

| Insulator substrate | CTE | Radiator base | CTE |
| --- | --- | --- | --- |
| Aluminum nitride | 4.5 ppm/K | Aluminum | 23.1 ppm/K |
| Copper | 16.5 ppm/K | Alumina (Al2O3) | 7.8 ppm/K |
| Silicon nitride | 3.4 ppm/K | C/C material | 7.2 ppm/K |

FIG. 11 is a chart showing an amount of camber Δt (μm) of a radiator base with time (h) in a case that the radiator base is bonded to the circuit board with a Pb-containing solder and in a case that the radiator base is bonded to the circuit board with a Pb-free solder. The Pb-containing solder contains tin (Sn) as a base and 60 weight % of Pb. The Pb-free solder contains tin (Sn) as a base and 5 weight % of antimony (Sb).

As shown in FIG. 11, in the case that the Pb-containing solder is used, the radiator base bonded to the circuit board returns to a flat shape with time, since the Pb-containing solder creeps and relaxes thermal stress therein. On the other hand, in the case that the Pb-free Sn solder is used in view of recent demand for environmental safety, since the solder is rigid and hardly deforms by creeping, the camber of the radiator base remains as a convex deformation. For example, when the radiator base 103 is made of a copper plate having a length of 90 mm to 110 mm, a width of 43 mm to 60 mm, and a thickness of 3 mm, the amount of the camber (Δt in FIG. 9) becomes 0.3 mm to 0.7 mm.

When such a large camber is generated, it is difficult to accurately assemble the semiconductor device in an assembling step after the soldering step. The semiconductor device 101 is provided with the radiator base 103 having the heat dissipating means 120 such as a heat sink with cooling fins. When the radiator base is cambered, a gap is formed between the semiconductor device 101 and the heat dissipating means 120, thereby reducing a contact area between the semiconductor device 101 and the heat dissipating means 120. As a result, the thermal contact resistance is increased, and it is difficult to dissipate the heat generated in the semiconductor chip 102, so that the semiconductor chip 102 may be damaged due to an abnormal increase in a temperature.

In the semiconductor device used in a vehicle, it has been required to improve reliability during a heat cycle test. A life of the semiconductor device during the heat cycle test depends on a life of the solder layer between the circuit board and the radiator base. This is because the thermal expansion difference between the soldered constituent elements (the circuit board and the radiator base) generates thermal stress in the solder layer, and finally breaks down the solder layer. Therefore, it is desirable to reduce the thermal stress and improve the thermal conduction efficiency.

Also, in the semiconductor device used in a vehicle, it has been required to make the semiconductor device light weight. To meet the demand, there has been proposed a technique in which a plate member formed of a carbon-based metal composite material is soldered to a circuit board having a circuit part mounted thereon (refer to Japanese Patent Publication (Kokai) No. 2001-58255). The carbon-based metal composite material is formed by impregnating molten aluminum, copper, silver or an alloy of these metals into a carbon pre-form made of carbon particles or carbon fibers containing graphite crystals under pressure. With the technique, the radiator base is formed of a substrate with lightweight and high thermal conductivity. The substrate also has a low modulus in a direction perpendicular to a surface thereof, so that mechanical workability thereof is excellent. Accordingly, it is possible to prevent the breakdown in the bonding portion due to the thermal stress.

Japanese Patent Publication (Kokai) No. 11-54677 has proposed a technique using a heat-dissipating carbon composite in which a liquid hardening material is impregnated into a pre-form carbon composite containing carbon fibers aligned in thickness direction, thereby improving the thermal conductivity and strength thereof.

Japanese Patent Publication (Kokai) No. 2001-39777 has disclosed a radiator base made of a short carbon fiber reinforced carbon composite having anisotropic thermal conductivity.

In the techniques described above, it is still difficult to sufficiently improve the heat dissipation performance and prevent the deformation in the bonding portion due to the thermal stress, thereby making it difficult to obtain a semiconductor device exhibiting excellent performance.

In view of the problems described above, an object of the present invention is to provide a semiconductor device in which the heat dissipation performance thereof is improved, and the deformation in the bonding portion thereof due to the thermal stress is prevented. Further, it is possible to accurately assemble the semiconductor device in the manufacturing process, thereby improving the reliability and reducing a weight thereof.

Another object of the present invention is to provide a method of manufacturing the semiconductor device.

Further objects and advantages of the invention will be apparent from the following description of the invention.

SUMMARY OF THE INVENTION

According to a first aspect of the invention, a semiconductor device includes a circuit board formed of an insulator substrate having conductor patterns on two surfaces thereof; a semiconductor chip bonded to one of the surfaces of the circuit board via the conductor pattern; and a radiator base bonded to the other of the surfaces of the circuit board via a solder layer and the conductor pattern for conducting heat generated in the semiconductor chip to external heat dissipating means arranged on a side of the radiator base opposite to the conductor pattern. The radiator base is made of a material exhibiting anisotropic thermal conductivity. The radiator base is formed such that a thermal conductivity along a bonding portion or bonding plane between the radiator base and the circuit board is smaller than that in a direction of the bonding portion, i.e. a thickness direction. The material of the radiator base is selected such that a difference between a thermal expansion coefficient of the radiator base along the bonding portion between the radiator base and the circuit board and a thermal expansion coefficient of the insulator substrate along the bonding portion is equal to or smaller than a predetermined value, so that the solder layer is not broken down due to the thermal stress between the radiator base and the circuit board.

In the first aspect of the invention, the insulator substrate and the conductor patterns on the surfaces of the insulator substrate constitute the circuit board. The semiconductor chip is bonded to the circuit board by soldering. Alternatively, the semiconductor chip may be bonded directly to the circuit board by partial welding.

In the semiconductor device, the radiator base is formed of a material exhibiting anisotropic thermal conductivity. The radiator base is formed such that the thermal conductivity along the bonding portion between the radiator base and the circuit board is smaller than that in a direction of the bonding portion, i.e. the thickness direction. Accordingly, the heat in the circuit board is conducted effectively to the external heat dissipating means.

In the semiconductor device, the difference between the thermal expansion coefficient of the radiator base along the bonding portion between the radiator base and the circuit board and the thermal expansion coefficient of the insulator substrate along the bonding portion is set to be equal or smaller than the predetermined value. Accordingly, the solder layer is prevented from being broken down by the thermal stress between the radiator base and the circuit board. As a result, it is possible to reduce deformation of the bonding portion due to the thermal stress, thereby improving the heat dissipation performance of the semiconductor device. Also, the assembly precision in the manufacturing process is improved, and the reliability of the semiconductor device is improved.

In the first aspect of the present invention, the breakdown of the solder layer between the radiator base and the circuit board is prevented. Since the deformation of the solder layer between the radiator base and the circuit board is prevented, the breakdown of the bonding portion between the semiconductor chip and the circuit board is also prevented.

In the semiconductor device, when the heat from the circuit board is conducted to the radiator base, the heat from the circuit board is diffused along the bonding plane. Accordingly, the conduction area of the heat conducted from the radiator base to the external heat dissipating means is increased, thereby improving the heat dissipation efficiency. The conductor pattern interposed between the insulator substrate and the radiator base may have a thickness equal to or greater than a predetermined value, so that a quantity of the heat from the circuit board diffused along the bonding plane is maintained below a predetermined quantity.

In the semiconductor device having the structure described above, the heat generated in the semiconductor chip is diffused along the bonding plane before reaching the radiator base, thereby increasing the heat dissipation area of the radiator base. Further, the radiator base has the anisotropic thermal conductivity, so that the heat is conducted quickly from the radiator base to the external heat dissipating means. As a result, the dissipation efficiency of the heat generated in the semiconductor chip is improved.

According to a second aspect of the invention, a method of manufacturing a semiconductor device includes a step of forming conductor patterns on two surfaces of an insulator substrate to form a circuit board; a step of bonding a semiconductor chip to one of the two surfaces of the circuit board via the conductor pattern; and a step of bonding a radiator base to the other of the two surfaces of the circuit board via a solder layer and the conductor pattern for conducting heat generated in the semiconductor chip to external heat dissipating means arranged on a side of the radiator base opposite to the conductor pattern. The radiator base is made of a material exhibiting anisotropic thermal conductivity. The radiator base is formed such that a thermal conductivity along a bonding portion or bonding plane between the radiator base and the circuit board is smaller than that in a direction of the bonding portion, i.e. a thickness direction. The material of the radiator base is selected such that a difference between a thermal expansion coefficient of the radiator base along the bonding portion between the radiator base and the circuit board and a thermal expansion coefficient of the insulator substrate along the bonding portion is equal to or smaller than a predetermined value, so that the solder layer is not broken down due to the thermal stress between the radiator base and the circuit board. The steps of bonding the semiconductor chip to the circuit board via the conductor pattern and bonding the radiator base to the circuit board via the conductor pattern are performed simultaneously.

In the manufacturing method described above, the semiconductor chip and the radiator base are simultaneously soldered to the circuit board via the conductor patterns formed on the circuit board. In a conventional method, after a semiconductor chip is bonded to a circuit board, a radiator base is bonded to the circuit board with the semiconductor chip bonded thereto, thereby preventing breakdown of the bonding portion due to the thermal stress. In the second aspect of the invention, the semiconductor device has the structure capable of preventing the deformation thereof. Accordingly, it is possible to simultaneously bond the semiconductor chip and the radiator base to the circuit board. The method described above is especially useful for manufacturing the semiconductor device according to the first aspect of the invention, and improves the manufacturing efficiency.

DETAILED DESCRIPTION OF PREFERRED EMBODIMENTS

Figure 1:
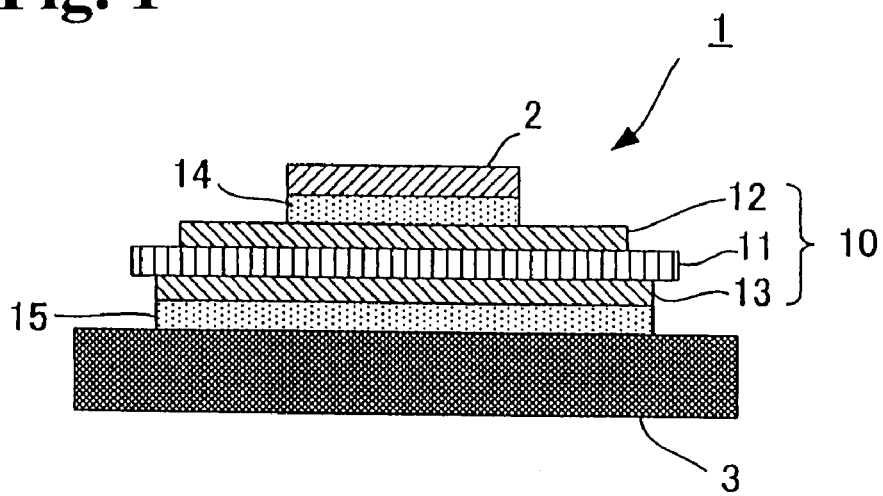
FIG. 1 is a schematic sectional view showing a semiconductor device according to an embodiment of the invention.

Hereunder, embodiments of the present invention will be described in detail with reference to the accompanied drawings. FIG. 1 is a schematic sectional view showing a semiconductor device according an embodiment of the invention.

Referring now to FIG. 1, a semiconductor device 1 includes a circuit board 10, a semiconductor chip 2 on a front surface of the circuit board 10, and a radiator base 3 on a back surface of the circuit board 10. When the semiconductor device 1 is installed in an electronic instrument, the radiator base 3 is attached to a heat sink or external heat dissipating means (not shown) having a cooling fin. In operating the electronic instrument, heat generated in the semiconductor chip 2 is conducted from the circuit board 10 to the heat sink via the radiator base 3 and dissipated from the heat sink.

In detail, the circuit board 10 includes a ceramic insulator substrate 11 made of aluminum oxide (alumina); a conductor pattern 12 on the front surface of the insulator substrate 11; and a conductor pattern 13 on the back surface of insulator substrate 11. The conductor patterns 12 and 13 are made of copper layers, and bonded to the insulator substrate 11 by direct bonding or active metal bonding. In the embodiment, the insulator substrate 11 is 62 mm in length, 37 mm in width, and 0.25 mm in thickness, and the conductor patterns 12 and 13 are 0.25 mm in thickness.

The semiconductor chip 2 is bonded to the conductor pattern 12 on the surface of the circuit board 10 via a solder layer 14 formed of an Sn—Ag system. The radiator base 3 is bonded to the conductor pattern 13 on the other surface of the circuit board 10 via a solder layer 15 formed of an Sn—Sb system. The semiconductor chip 2 is formed of a silicon chip such as an IGBT and a FWD. The radiator base 3 is made of a carbon fiber composite material or a carbon composite material (hereinafter referred to as "C/C material") as described in Japanese Patent Publication (Kokai) No. 06-128063. The C/C material is prepared by impregnating molten metal such as aluminum and copper into a carbon material (porous carbon material).

A thermal expansion coefficient of the C/C material can be adjusted by changing an impregnation ratio (content) of the metal. With increasing the metal ratio, the thermal expansion coefficient of the C/C material becomes larger and closer to the thermal expansion coefficient of the metal. With increasing the carbon ratio, the thermal expansion coefficient of the C/C material becomes smaller and closer to the thermal expansion coefficient of carbon.

In the embodiment, the radiator base 3 is formed of the C/C material exhibiting anisotropic thermal conductivity, so that the heat generated in the semiconductor chip 2 is effectively conducted to the heat sink via the circuit board 10. The C/C material is formed so that the thermal conductivity in a thickness direction of the radiator base 3, i.e. a bonding direction of the radiator base 3 to the insulator substrate 11, is higher than the thermal conductivity of the radiator base 3 along a bonding plane between the radiator base 3 and the insulator substrate 11. In the semiconductor device, the radiator base 3 is 90 mm in length, 43 mm in width, and 3 mm in a thickness. The thermal conductivity of the radiator base 3 in the bonding direction of the radiator base 3 to the circuit board 10 is designed to be 320 W/m·K. The thermal conductivity of the radiator base 3 along the bonding plane between the radiator base 3 and the circuit board 10 (a direction perpendicular to the bonding direction) is designed to be 172 W/m·K. In the embodiment, a nickel (Ni—P plating) layer having a thickness of 5 μm is plated on the radiator base 3.

To minimize a camber of the radiator base 3 immediately after the radiator base 3 is soldered to the circuit board 10, the material of the radiator base 3 is selected so that a difference between the thermal expansion coefficient of the radiator base 3 along the bonding plane between the radiator base 3 and the insulator substrate 11 and a thermal expansion coefficient of the circuit board 10 (thermal expansion coefficient of the insulator substrate 11) along the bonding plane is smaller than a predetermined value small enough to prevent the solder layer 15 from being broken down due to thermal stress between the radiator base 3 and the circuit board 10. In other words, the thermal expansion coefficient of the radiator base 3 is controlled through adjusting the metal content therein, so that the preferable relation between the thermal expansion coefficients is obtained.

Although the difference is preferably closer to zero, it is possible to set the difference empirically at an appropriate value through an experiment considering a practical and selectable range or a safety factor in design. In the embodiment, the insulator substrate 11 is made of alumina, and the thermal expansion coefficient thereof is about 7.8 ppm/K.

The radiator base 3 is made of the C/C material, and the thermal expansion coefficient thereof in the bonding direction is about 4 ppm/K, and the thermal expansion coefficient thereof along the bonding plane between the radiator base 3 and the insulator substrate 11 is about 7 ppm/K.

In the embodiment, the conductor pattern 13 interposed between the insulator substrate 11 and the radiator base 3 has a thickness equal to or greater than a predetermined value, so that the heat conducted via the circuit board 10 is diffused along the bonding plane between the circuit board 10 and the radiator base 3 before being conducted to the radiator base 3.

That is, the radiator base exhibits the anisotropic thermal conductivity such that the thermal conductivity in the thickness direction thereof, i.e. the direction perpendicular to the bonding plane between the insulator substrate 11 and the radiator base 3, is greater than the thermal conductivity thereof along the bonding plane. When the conductor pattern 13 has a small thickness, the heat generated in the semiconductor chip 2 is conducted through a conduction area thereof as it is (area through which the heat is conducted) via the circuit board 10 to the radiator base 3 and further to the heat sink.

Therefore, it is arranged such that the conductor pattern 13 with isotropic thermal conductivity (or anisotropic thermal conductivity to a small extent) has a thickness greater than a certain value, so that the heat conducted via the insulator substrate 11 is diffused in advance along the bonding plane between the insulator substrate 11 and the radiator base 3, thereby increasing the thermal conduction area. Accordingly, the radiator base 3 receives the heat through a larger thermal conduction area. In addition, the radiator base 3 has the anisotropic thermal conductivity (higher thermal conductivity in a direction perpendicular to the bonding plane), so that the heat is conducted quickly from the radiator base 3 to the heat sink.

As described above, the semiconductor device 1 has the structure in which the heat dissipation performance thereof is improved and the deformation due to the thermal stress in the bonding portion caused by the thermal expansion coefficient difference is suppressed or prevented, thereby facilitating manufacture of the semiconductor device 1.

That is, in the semiconductor device 1, it is possible to suppress or prevent the deformation of the soldering radiator base 3 when the soldering radiator base 3 is soldered to the circuit board 10. Therefore, when the semiconductor chip 2 and the radiator base 3 are simultaneously bonded to the insulator substrate 11 with the conductor patterns 12 and 13 formed thereon, it is possible to prevent the breakage of the bonding portions due to the thermal stress.

Therefore, in manufacturing the semiconductor device according to the embodiment of the invention, after the conductor patterns 12 and 13 are formed on the insulator substrate 11, the semiconductor chip 2 and the radiator base 3 are bonded simultaneously to the insulator substrate 11 via the conductor patterns.

Heat cycle tests were conducted to determine a magnitude of the camber of the radiator base, a temperature rise in the semiconductor chip, and a fatigue lifetime of the solder layer for the semiconductor device according to the embodiment of the invention as opposed to a conventional semiconductor device. Results are shown in Tables 2 through 4 and FIGS. 2 through 7.

Table 2 shows a change in the magnitude of the camber for the radiator base with a different material and a different solder after the radiator base was soldered. In the test, the radiator base of the embodiment was formed of the C/C material (hereinafter referred to as "C/C radiator base"). The conventional radiator base was formed of a copper plate (hereinafter referred to as "copper radiator base"). The C/C radiator base and the copper radiator base were bonded to the circuit board with a Pb-containing solder and a Pb-free solder.

The radiator bases used in the test were 90 mm in length, 43 mm in width, and 3 mm in thickness (hereinafter, described as "90 mm×43 mm×3 mm"). The insulator substrates 11 used in the test were 62 mm×37 mm×0.25 mm. The soldering was conducted at 300° C. for 6 min.

TABLE 2

|  | C/C radiator base | Copper radiator base |
| --- | --- | --- |
| Pb-containing solder | 0 μm | −90 μm |
| Pb-free solder | 0 μm | −350 μm |

Figure 4:
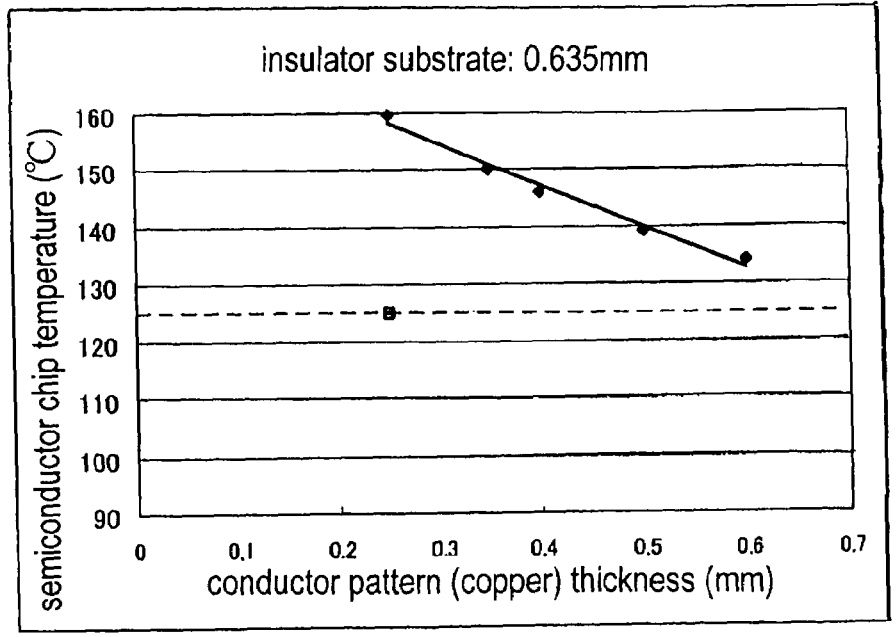
FIG. 4 is a graph showing a relationship between a temperature of a semiconductor chip and a thickness of a copper conductor pattern.

As shown in Table 2, the magnitude of the camber of the copper radiator base is 90 μm when the Pb-containing solder was used. The magnitude of the camber caused of the C/C radiator base is 0 μm when the Pb-containing solder was used. (In Table 2, the magnitude of the upward convex camber as shown in FIG. 4 is expressed as a negative value.) When the Pb-free solder was used, the magnitude of the camber of the copper radiator base is 350 μm, while the magnitude of the camber of the C/C radiator base is 0 μm.

When the Pb-containing solder was used, the magnitudes of the cambers of the C/C radiator base and the copper radiator base are small due to the creeping phenomena described above. Even when the Pb-free solder was used, the magnitude of the camber of the C/C radiator base is 0 μm. This is probably because the radiator base formed of the C/C material has the thermal expansion coefficient along the bonding plane between the radiator base and the circuit board closer to the thermal expansion coefficient of the circuit board along the bonding plane, so that the deformation of the radiator base due to the thermal stress is prevented. Accordingly, in the embodiment, it is possible to use the Pb-free solder to manufacture the semiconductor device, thereby providing the semiconductor device having a Pb-free structure and meeting demand for environmental safety.

Table 3 shows a heat dissipation effect function of the insulator substrate. In the embodiment with the C/C radiator base and the conventional device with the copper radiator base, the insulator substrate formed of alumina or aluminum nitride was used, and the temperature rise in the semiconductor chip on the insulator substrate was measured.

In this test, the C/C radiator base and the copper radiator base were the same as those used in the camber test described above, and the semiconductor chip was 9.8 mm×9.8 mm×0.15 mm. The insulator substrate formed of alumina has a thickness of 0.25 mm, and the insulator substrate formed of aluminum nitride has a thickness of 0.635 mm. The copper conductor patterns having a thickness of 0.25 mm were formed on both surfaces of the insulator substrates. After the electric power of 160 W was supplied to the semiconductor chips for 5 min, the temperature rise in the semiconductor chips was measured.

TABLE 3

| Insulator substrate | C/C radiator base | Copper radiator base |
|---|---|---|
| Alumina | 133° C. | 125° C. |
| Aluminum nitride | 109° C. | 102° C. |

As shown in Table 3, when the insulator substrate is formed of aluminum nitride, it is possible to suppress the temperature rise in the semiconductor chip with the C/C radiator base as effectively as in the conventional structure. In other words, the similar heat dissipation effect is obtained even when the C/C material, less thermally conductive than copper, is used. Although not shown in Table 3, it was confirmed that the same effect as that of the aluminum nitride insulator substrate is obtained when the insulator substrate is formed of silicon nitride as opposed to aluminum nitride.

FIGS. 2 through 7 show a heat dissipation effect when the conductor pattern on the insulator substrate has a different thickness. In the tests, the C/C material was used for the radiator base in the embodiment, and the temperature rise in the semiconductor chip on the insulator substrate formed of alumina, aluminum nitride, and silicon nitride was measured.

In FIGS. 2 through 7, the results of the C/C radiator base are represented by solid lines. For comparison, the temperature rise in a comparative example (conventional structure) using the conventional copper radiator base is represented by a hidden line. The comparative example had the insulator substrate formed of alumina ceramic, and the conductor patterns on the insulator substrate were formed of thermally isotropic copper. The copper conductor patterns in the comparative example were 0.25 mm in thickness. The temperature rise in the semiconductor chip of the comparative example was 125° C.

Figure 2:
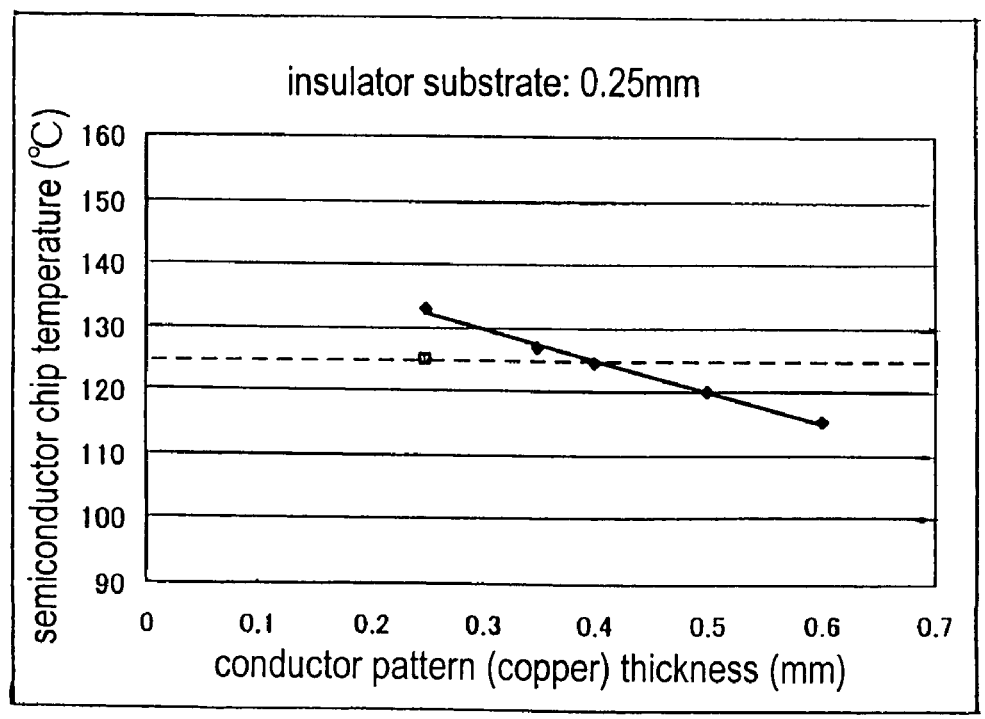
FIG. 2 is a graph showing a relationship between a temperature of a semiconductor chip and a thickness of a copper conductor pattern.
Figure 3:
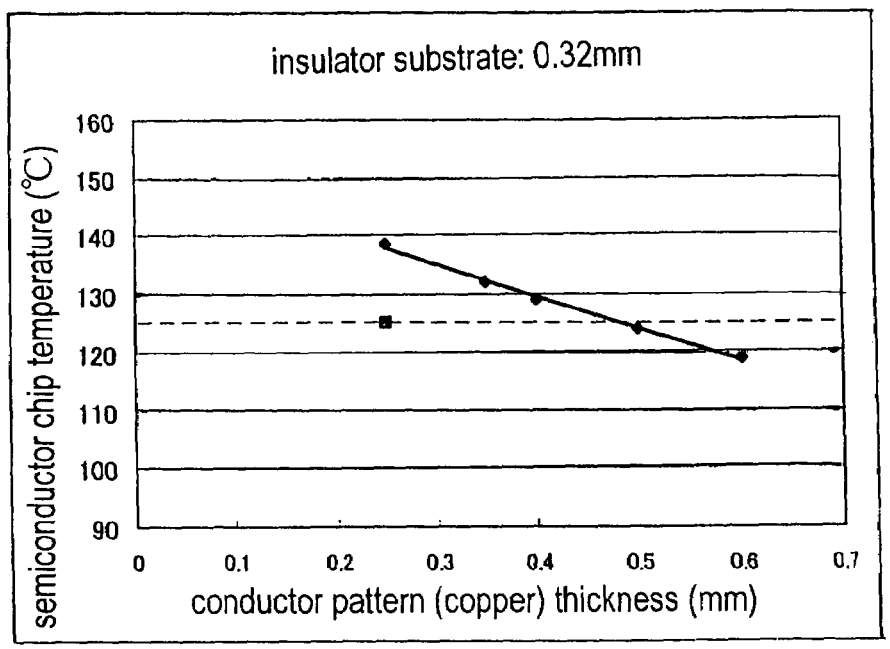
FIG. 3 is a graph showing a relationship between a temperature of a semiconductor chip and a thickness of a copper conductor pattern.

In FIGS. 2 through 4, the insulator substrate formed of alumina was used similar to the comparative example, and the thickness of the insulator substrate was 0.25 mm in FIG. 2, 0.32 mm in FIG. 3, and 0.635 mm in FIG. 4. The same radiator base and the same semiconductor chip as described above were used in FIGS. 2 through 4.

As shown in FIGS. 2 through 4, the circuit boards had thicknesses of 0.25 mm, 0.35 mm, 0, 40 mm, 0.50 mm and 0.60 mm, respectively. After the electric power of 160 W was supplied to the semiconductor chip on the circuit boards described above for 5 min, the temperature rise in the semiconductor chip was measured.

As shown in FIGS. 2 through 4, the temperature rise in the semiconductor chip decreases with increasing the thickness of the conductor pattern, indicating higher heat dissipation effect. It is also found that the temperature rise in the semiconductor chip increases with increasing the thickness of the insulator substrate (alumina).

Figure 5:
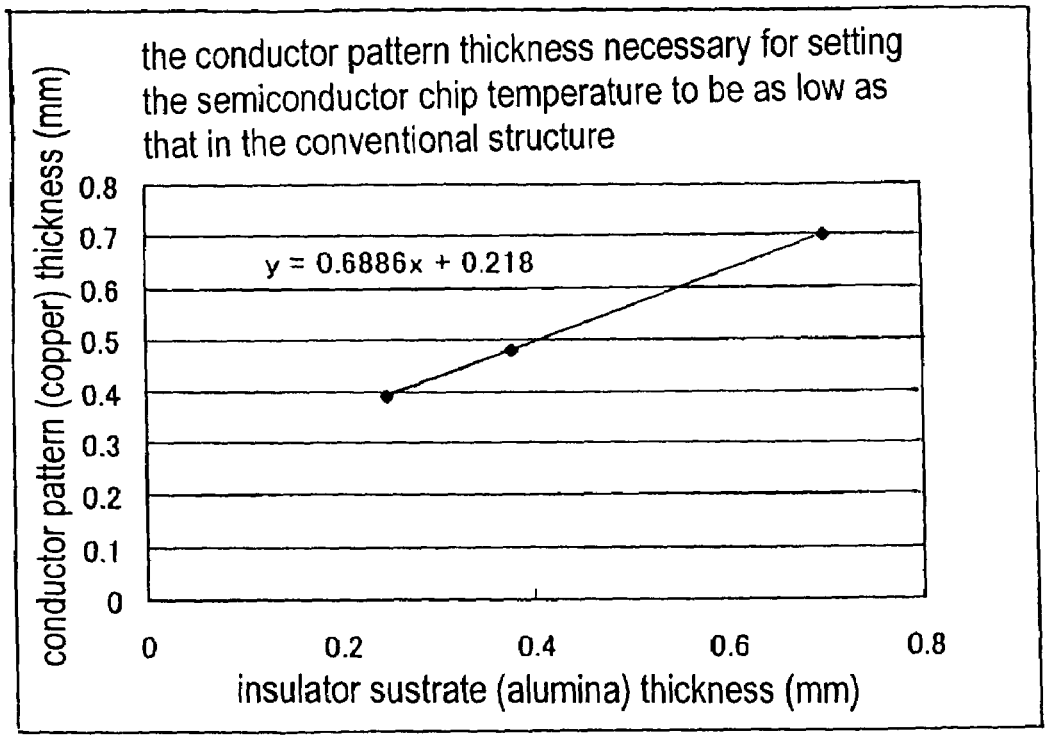
FIG. 5 is a graph showing a relationship between a thickness of a copper conductor pattern and a thickness of an alumina insulator substrate.

Based on the data shown in Tables 2 through 4, a relationship between the insulator substrate (alumina) thickness x and the conductor pattern (copper) thickness y is established as shown in FIG. 5. The relationship is expressed by the following equation (1), and it is possible to determine a thickness of the conductor pattern to obtain the chip temperature equal to or lower than that of the comparative example (conventional structure).

$$y \geq 0.6886x + 0.218 \quad (1)$$

Accordingly, when the conductor pattern has the thickness y within the range shown above, the heat dissipation effect becomes more effective than the conventional structure.

In detail, when the conductor pattern has a thickness within the range described above, the heat generated below the semiconductor chip and the insulator substrate is diffused laterally (along the bonding plane), thereby suppressing the temperature rise in the semiconductor chip. Accordingly, when the conductor pattern has a thickness greater than a certain value, it is possible to suppress the temperature rise in the semiconductor chip as effectively as the conventional structure even when the C/C material with the anisotropic thermal conductivity is used. In other words, a disadvantage of the anisotropic thermal conductivity of the C/C material can be compensated regardless of the thermal conductivity of the insulator substrate.

Figure 6:
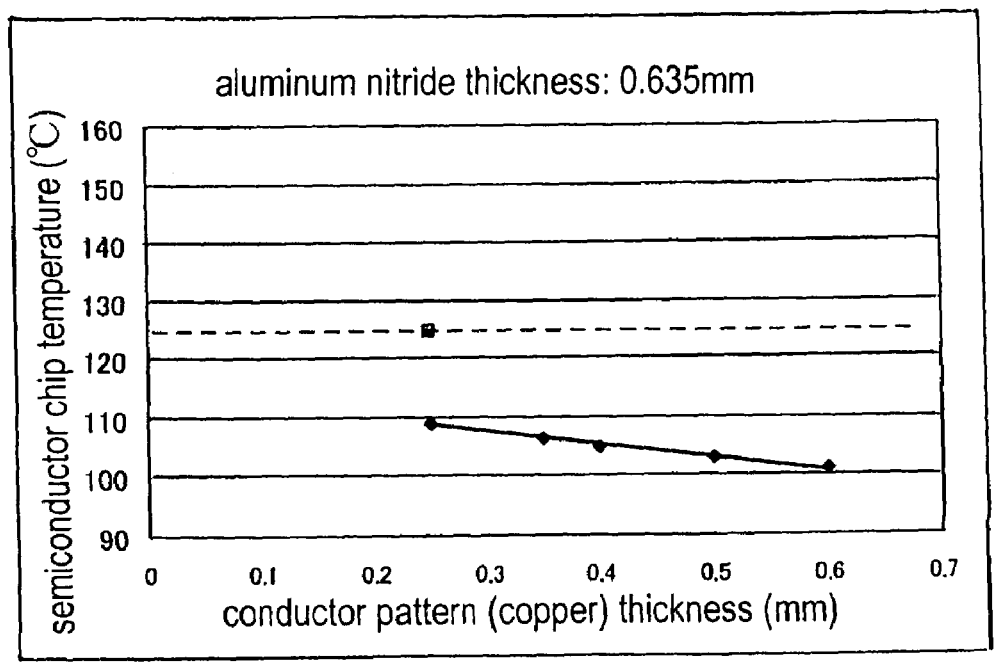
FIG. 6 is a graph showing a relationship between a temperature of a semiconductor chip and a thickness of a copper conductor pattern.
Figure 7:
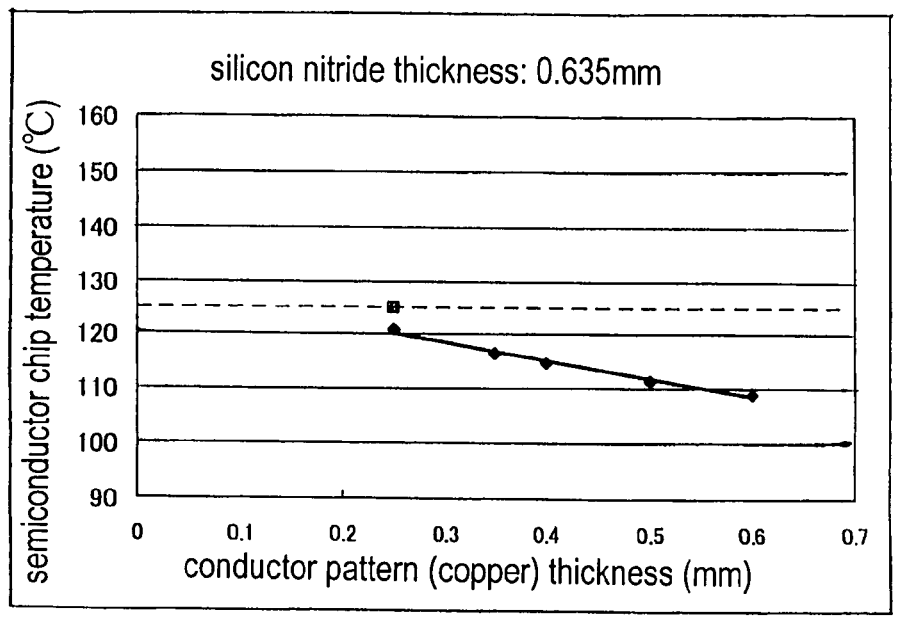
FIG. 7 is a graph showing a relationship between a temperature of a semiconductor chip and a thickness of a copper conductor pattern.
Figure 8:
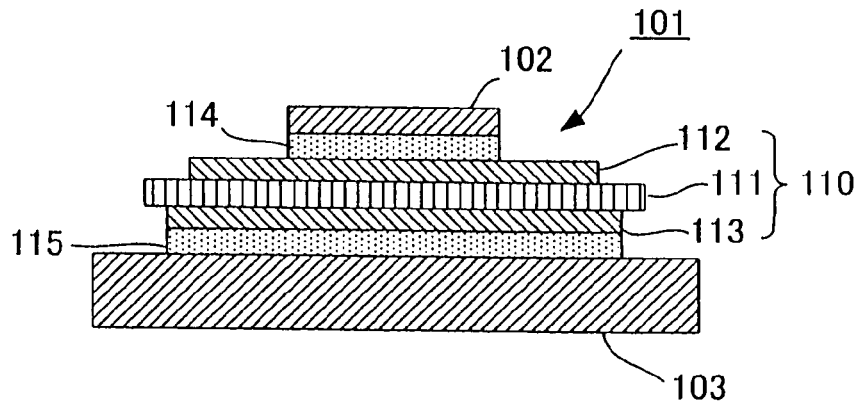
FIG. 8 is a cross sectional view of a conventional semiconductor device having an external radiating means.
Figure 9:
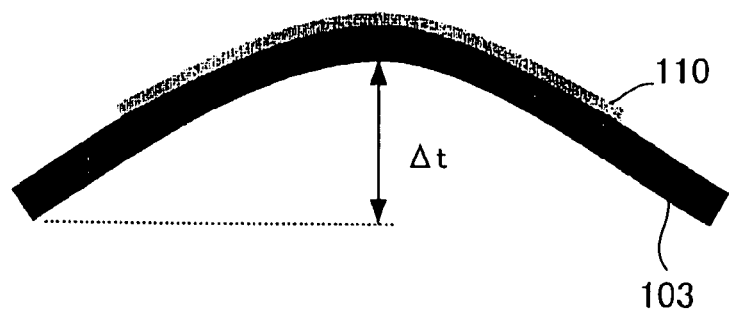
FIG. 9 is a cross sectional view for explaining a problem of a conventional semiconductor device.
Figure 10:
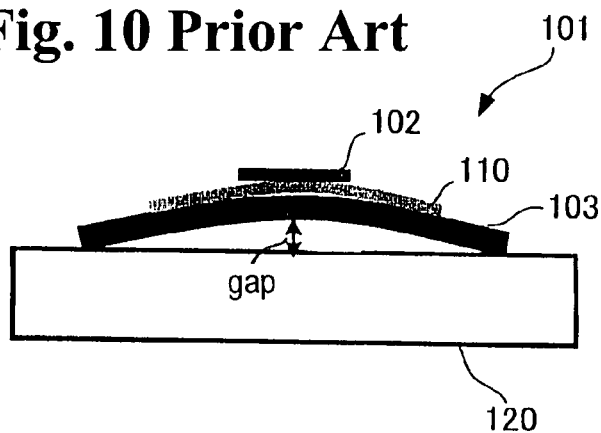
FIG. 10 is a cross sectional view for explaining a problem of a conventional semiconductor device.
Figure 11:
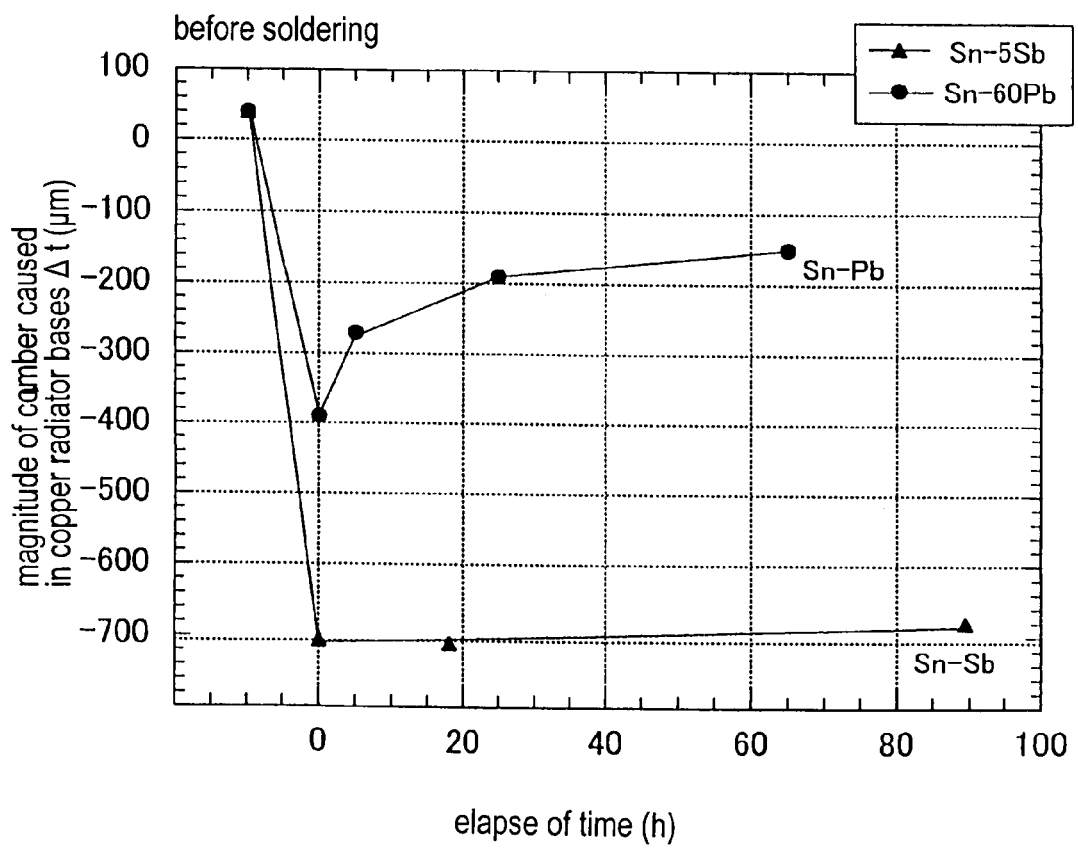
FIG. 11 is a graph showing an amount of a camber of a copper radiation base with time for explaining a problem of a conventional semiconductor device.

In FIGS. 6 and 7, the insulator substrate was formed of aluminum nitride and had a thickness of 0.635 mm. The same radiator base and the same semiconductor chip as described above were used.

As shown in FIGS. 6 and 7, the conductor patterns had thicknesses of 0.25 mm, 0.35 mm, 0, 40 mm, 0.50 mm and 0.60 mm, respectively. After the electric power of 160 W was supplied to the semiconductor chip on the circuit board described above for 5 min, the temperature rise in the semiconductor chip was measured. The comparative example was the same as described above.

As shown in FIGS. 6 and 7, the temperature rise in the semiconductor chip decreases with increasing the thickness of the conductor pattern, indicating higher heat dissipation effect. The temperature rise in each of the conductor patterns is smaller than that in the semiconductor chip of the comparative example.

Accordingly, it is revealed that when the insulator substrate is formed of aluminum nitride or silicon nitride, the thermal dissipation effect is better than the conventional structure regardless of the thickness.

However, the insulator substrate formed of alumina is generally less expensive than the insulator substrate formed of aluminum nitride or silicon nitride. Therefore, it is preferred that the insulator substrate is formed of alumina and has a thickness within the range described above.

Table 4 shows a lifetime of the solder layer between the radiator base with a different material and the insulator substrate. In the test, a strain in the solder layer was measured to determine the lifetime of the solder layer for the C/C radiator base according to the embodiment and the conventional copper radiator as the comparative example.

In the test, the embodiment and the comparative example had the radiator base and the semiconductor chip same as those described above. The insulator substrate in the circuit board was formed of alumina and had a thickness of 0.25 mm. The copper conductor patterns with a thickness of 0.25 mm were formed on both surfaces of the insulator substrate. The semiconductor device was placed in a first vessel at −40° C. for 1 hour, in a second vessel at the room temperature (25° C.) for 30 min., and in a third vessel kept at 125° C. for 1 hour. This heat cycle was repeated until the solder layer was broken down, thereby determining the lifetime (number of cycles). Also, the semiconductor device placed in the third vessel at 125° C. was taken out, and the strain in the solder layers was measured.

TABLE 4

| | C/C radiator base | Copper radiator base |
|---|---|---|
| Strain Δγ (%) | 0.73 | 1.28 |
| Lifetime | 15,000 | 2,000 |

As shown in Table 4, the strain in the solder layer of the comparative example is 1.28%, and the strain in the solder layer of the embodiment is 0.73%. Accordingly, when the radiator base is formed of the C/C material, it is possible to reduce the strain. The comparative example shows the lifetime of the solder layer of 2,000 cycles (measured), and the embodiment shows 15,000 cycles (calculated based on the strain-lifetime curve). Accordingly, when the radiator base is formed of the C/C material, it is possible to extend the lifetime of the solder layer.

As described above, when the radiator base has the thermal expansion coefficient close to that of the insulator substrate, the lifetime of the solder layer is extended and the reliability thereof is improved. This is because the shear strain is caused in the solder layer due to the difference in the thermal expansion coefficients between the circuit board (insulator substrate) and the radiator base, thereby promoting the fatigue in the solder layer. When the difference in the thermal expansion coefficients is minimized, it is possible to extend the lifetime of the solder layer.

When the insulator substrate is formed of alumina, less expensive than aluminum nitride and silicon nitride, it is still possible to obtain the advantage, thereby providing the semiconductor device with low cost.

Further, when the radiator base is formed of the C/C material, the radiator base is lighter than the conventional copper radiator base (¼ of the conventional copper radiator base), thereby reducing the total weight of the semiconductor device.

As described above, the embodiments of the invention have been described, but the invention is not limited to the embodiments, and various changes and modifications are possible. For example, the materials and the dimensions of the circuit board, the conductor patterns, the semiconductor chip, and the radiator base are just examples. Other materials and dimensions are possible for obtaining the effects of the invention. For example, the radiator base of the embodiment is formed of the C/C material. Alternatively, the radiator base may be formed of a clad material formed of Cu—36Ni. Fe—Cu multi-layers as the material with the anisotropic thermal conductivity and anisotropic thermal expansion coefficients. Also, Cu—SiC, Cu—Cu$_2$O, Al—SiC, Cu—W, Cu—Mo, Cu—Mo—Cu, and Cu—Cu—Mo—Cu may be used for the radiator base as the material with a low thermal expansion coefficient.

In the embodiments, the semiconductor chip and the radiator base are bonded to the insulator substrate with soldering. The semiconductor chip and the radiator base may be bonded to the insulator substrate with brazing.

In the embodiments, the conductor patterns formed on both surfaces of the insulator substrate have a same thickness. Alternatively, the conductor pattern between the semiconductor chip and the insulator substrate may have a thickness larger than that of the conductor pattern between the radiator base and the insulator substrate. This structure is effective in dissipating the heat in the semiconductor chip.

In the embodiments, the insulator substrate is the ceramic substrate such as an alumina substrate. The insulator substrate may be formed of a resin, thereby forming a so-called printed circuit board.

As described above, according to the invention, the radiator base in the semiconductor device is made of a material exhibiting the anisotropic thermal conductivity, so that the thermal conductivity is high in a direction perpendicular to the bonding plane between the radiator base and the circuit board, and the difference between the thermal expansion coefficient of the radiator base along the bonding plane between the radiator base and the circuit board and the thermal expansion coefficient of the insulator substrate along the bonding plane is small.

As a result, the heat dissipation performance of the semiconductor device is improved, and the deformation of the bonding portion caused by the thermal stress is suppressed or prevented. Also, the assembly precision in the manufacturing process is secured, and the performances and the reliability of the semiconductor device are improved.

According to the invention, the conductor pattern interposed between the insulator substrate and the radiator base has the thickness of a predetermined value or greater, so that the heat conducted from the insulator substrate is diffused before reaching the radiator base, thereby increasing the heat dissipation area in the radiator base. As a result, the dissipation efficiency of the heat generated in the semiconductor chip is further improved.

While the invention has been explained with reference to the specific embodiments of the invention, the explanation is illustrative and the invention is limited only by the appended claims.

What is claimed is:

1. A semiconductor device comprising:
   a circuit board having an insulator substrate and conductor patterns on two surfaces of the insulator substrate,
   a semiconductor chip bonded to one of surfaces of the circuit board through one of the conductor patterns therebetween,
   a radiator base bonded to the other of the surfaces of the circuit board through the other of the conductor patterns therebetween for conducting heat generated in the semiconductor chip toward an outside radiation device located at a side opposite to the other of the conductor patterns, and
   a Pb-free solder layer for connecting the radiator base to said other of the surfaces of the circuit board,
   wherein said radiator base is formed of a material having anisotropic thermal conductivity so that the radiator base has thermal conductivity in a thickness direction perpendicular to a bonding plane between the radiator base and the circuit board higher than that along the bonding plane, said material of the radiator base being selected such that thermal expansion coefficient of the radiator base is equal to or less than that of the insulator substrate and difference of the thermal expansion coefficient between the radiator base and the insulator substrate along the bonding plane is less than a predetermined value to prevent the solder layer from being broken by thermal stress created between the radiator base and the circuit board.

2. A semiconductor device according to claim 1, wherein said radiator base is formed of a carbon fiber composite material or a carbon composite material containing a porous carbon material and a predetermined metal impregnated into the porous carbon material.

3. A semiconductor device according to claim 2, wherein said radiator base contains a predetermined amount of the metal such that the radiator base has the thermal expansion coefficient along the bonding plane between the radiator base and the circuit board substantially same as that with the insulator substrate along the bonding plane.

4. A semiconductor device according to claim 1, wherein said insulator substrate is formed of a ceramic material containing aluminum nitride or silicon nitride.

5. A semiconductor device according to claim 1, wherein the other of the conductor patterns disposed between the insulator substrate and the radiator base has a thickness greater than a predetermined value so that the heat generated in the semiconductor chip is diffused along the bonding plane for a quantity larger than a predetermined quantity.

6. A semiconductor device according to claim 5, wherein said insulator substrate is formed of an alumina ceramic material and has a thickness of x, and the other of said conductor patterns is formed of copper and has a thickness of y so that x and y satisfy a following equation, $y \geq 0.6886x + 0.218.$ 7. A semiconductor device according to claim 1, wherein said radiator base is made of a clad material formed of Cu-36Ni.Fe—Cu multi-layers.

8. A semiconductor device according to claim 1, wherein said material of the radiator base is selected from a group consisting of Cu—SiC, Cu—Cu$_2$O, Al—SiC, Cu—W, Cu—Mo, Cu—Mo—Cu, and Cu—Cu.Mo—Cu.

9. A method of manufacturing a semiconductor device, comprising:
    forming conductor patterns on two surfaces of an insulator substrate to form a circuit board,
    selecting and arranging for a radiator base a material exhibiting anisotropic thermal conductivity so that the radiator base has thermal conductivity in a thickness direction perpendicular to a bonding plane between the radiator base and the circuit board higher than that along the bonding plane, said material of the radiator base being selected such that thermal expansion coefficient of the radiator base is equal to or less than that of the insulator substrate and difference of the thermal expansion coefficient between the radiator base and the insulator substrate along the bonding plane is less than a predetermined value to prevent the solder layer from being broken by thermal stress created between the radiator base and the circuit board, and
    bonding at a same time a semiconductor chip to one of the two surfaces of the circuit board through one of the conductor patterns therebetween, and the radiator base to the other of the two surfaces of the circuit board through the other of the conductor patterns therebetween by Pb-free solder.

10. A method according to claim 9, wherein the other of said conductor patterns disposed between the insulator substrate and the radiator base has a thickness greater than a predetermined value so that the heat generated in the semiconductor chip is diffused along the bonding plane for a quantity larger than a predetermined quantity.

* * * * *

UNITED STATES PATENT AND TRADEMARK OFFICE
CERTIFICATE OF CORRECTION

PATENT NO. : 7,038,313 B2
APPLICATION NO. : 10/832253
DATED : May 2, 2006
INVENTOR(S) : Eiji Michizuki et al.

It is certified that error appears in the above-identified patent and that said Letters Patent is hereby corrected as shown below:

Please change column 6, line 40, "W/m· K." to -- W/m.K. --,

Column 6, line 44, "W/m· K." to -- W/m.K. --,

Column 11, line 54, "Cu-Cu-Mo-Cu" to -- Cu-Cu· Mo-Cu --,

Column 13, line 27, "Cu-36Ni.Fe" to -- Cu-36Ni· Fe --, and

Column 13, line 31, "Cu-Cu.Mo-Cu" to -- Cu-Cu· Mo-Cu --.

Signed and Sealed this

Fourteenth Day of November, 2006

JON W. DUDAS
*Director of the United States Patent and Trademark Office*